(12) United States Patent
Karmazyn (10) Patent No.: US 7,712,213 B2
(45) Date of Patent: May 11, 2010

(54) ANGULAR ENCAPSULATION OF TANDEM STACKED PRINTED CIRCUIT BOARDS

(75) Inventor: Michael J. Karmazyn, Sparrows Point, MD (US)

(73) Assignee: AAI Corporation, Hunt Valley, MD (US)

( * ) Notice: Subject to any disclaimer, the term of this patent is extended or adjusted under 35 U.S.C. 154(b) by 26 days.

(21) Appl. No.: 11/606,961

(22) Filed: Dec. 1, 2006

(65) Prior Publication Data

US 2007/0125576 A1 Jun. 7, 2007

Related U.S. Application Data

(60) Provisional application No. 60/741,447, filed on Dec. 2, 2005.

(51) Int. Cl.
| | |
|---|---|
| H01R 43/00 | (2006.01) |
| H05K 13/00 | (2006.01) |
| H05K 3/36 | (2006.01) |
| H05K 3/30 | (2006.01) |
| B28B 1/00 | (2006.01) |
| B32B 15/00 | (2006.01) |

(52) U.S. Cl. .................. 29/855; 29/825; 29/830; 29/841; 264/612; 428/209

(58) Field of Classification Search .............. 29/825, 29/830, 841, 855; 264/612; 428/209
See application file for complete search history.

(56) References Cited

U.S. PATENT DOCUMENTS

| 2,892,013 | A | * | 6/1959 | Gomberg | 174/153 G |
|---|---|---|---|---|---|
| 3,084,391 | A | * | 4/1963 | Parstorfer | 249/97 |
| 3,247,575 | A | * | 4/1966 | Parstorfer | 29/827 |
| 3,325,881 | A | * | 6/1967 | Engelking | 264/104 |
| 3,829,263 | A | * | 8/1974 | Yao et al. | 425/145 |
| 4,017,495 | A | * | 4/1977 | Jaffe et al. | 264/272.17 |
| 4,082,916 | A | * | 4/1978 | Jaklic et al. | 174/524 |
| 4,226,651 | A | * | 10/1980 | Gold | 156/48 |
| 4,239,555 | A | * | 12/1980 | Scharlack et al. | 136/251 |
| 4,241,493 | A | * | 12/1980 | Andrulitis et al. | 438/67 |
| 4,339,407 | A | * | 7/1982 | Leighton | 264/229 |
| 5,079,190 | A | * | 1/1992 | Mihara | 438/26 |
| 5,243,756 | A | * | 9/1993 | Hamburgen et al. | 29/841 |
| 5,244,840 | A | * | 9/1993 | Kodai et al. | 29/841 |
| 5,251,373 | A | * | 10/1993 | DeCarlo et al. | 29/870 |
| 5,348,913 | A | * | 9/1994 | McBride et al. | 29/841 |

(Continued)

*Primary Examiner*—A. Dexter Tugbang
*Assistant Examiner*—David P Angwin
(74) *Attorney, Agent, or Firm*—Venable LLP; Jeffri A. Kaminski; Kyle D. Petaja (57) ABSTRACT

A method is provided for making an encapsulated stack of circuit boards. The method includes assembling the stack of circuit boards from a plurality of circuit boards, the circuit boards being spaced apart from each other; inserting the stack into an internal volume of a shell, the shell having a first end and a second end opposite the first end, an input orifice adjacent the first end, and an output orifice adjacent the second end and on a side opposite the input orifice; positioning the shell such that the input orifice is at a lowest point of any part of the internal volume of the shell, and such that the output orifice is at a highest point of any part of the internal volume of the shell; angling the shell relative to horizontal; and injecting an encapsulating compound into the input orifice to fill the internal volume of the shell with the encapsulating compound.

26 Claims, 6 Drawing Sheets

U.S. PATENT DOCUMENTS

| | | | | |
|---|---|---|---|---|
| 5,409,654 | A * | 4/1995 | Platusich | 264/161 |
| 5,568,684 | A * | 10/1996 | Wong | 29/840 |
| 5,578,261 | A * | 11/1996 | Manzione et al. | 264/272.15 |
| 5,607,882 | A * | 3/1997 | Lambert et al. | 264/272.14 |
| 5,609,889 | A * | 3/1997 | Weber | 425/116 |
| 5,640,760 | A * | 6/1997 | Val et al. | 29/830 |
| 5,665,281 | A * | 9/1997 | Drummond | 264/39 |
| 5,665,296 | A * | 9/1997 | Jain et al. | 264/272.15 |
| 5,692,296 | A * | 12/1997 | Variot | 29/827 |
| 5,728,600 | A * | 3/1998 | Saxelby et al. | 264/272.11 |
| 5,776,512 | A * | 7/1998 | Weber | 425/116 |
| 5,825,623 | A * | 10/1998 | Lee et al. | 361/707 |
| 5,939,778 | A * | 8/1999 | Boutin et al. | 257/678 |
| 5,945,130 | A * | 8/1999 | Saxelby et al. | 425/112 |
| 5,955,115 | A * | 9/1999 | Bolanos et al. | 425/116 |
| 6,000,924 | A * | 12/1999 | Wang et al. | 425/125 |
| 6,081,997 | A * | 7/2000 | Chia et al. | 29/841 |
| 6,136,236 | A * | 10/2000 | Boccard et al. | 264/40.1 |
| 6,220,876 | B1 * | 4/2001 | Avila et al. | 439/76.2 |
| 6,255,587 | B1 * | 7/2001 | Lambert et al. | 174/541 |
| 6,309,575 | B1 * | 10/2001 | Boutin et al. | 264/161 |
| 6,403,009 | B1 * | 6/2002 | Saxelby et al. | 264/272.15 |
| 6,414,396 | B1 * | 7/2002 | Shim et al. | 257/778 |
| 6,537,482 | B1 * | 3/2003 | Farnworth | 264/482 |
| 6,617,786 | B1 * | 9/2003 | Centofante | 313/512 |
| 6,709,626 | B2 * | 3/2004 | Eckardt et al. | 264/570 |
| 6,710,257 | B2 * | 3/2004 | Saxelby et al. | 174/255 |
| 6,787,093 | B2 * | 9/2004 | Kiritani | 264/511 |
| 6,800,807 | B2 * | 10/2004 | Ishiguro et al. | 174/50 |
| 6,811,738 | B2 * | 11/2004 | Magni et al. | 264/510 |
| 6,929,053 | B1 * | 8/2005 | Doty | 164/136 |
| 6,929,233 | B2 * | 8/2005 | Andin et al. | 249/109 |
| 7,101,737 | B2 * | 9/2006 | Cobbley | 438/125 |
| 7,109,591 | B2 * | 9/2006 | Hack et al. | 257/788 |

* cited by examiner

ANGULAR ENCAPSULATION OF TANDEM STACKED PRINTED CIRCUIT BOARDS

This application claims the benefit of U.S. Provisional Patent Application No. 60/741,447 filed Dec. 2, 2005, which is hereby incorporated by reference in its entirety.

The U.S. Government has a paid-up license in this invention and the right in limited circumstances to require the patent owner to license others on reasonable terms as provided for by the terms of DAAE 30-00-D-1015 awarded by the U.S. Army.

BACKGROUND OF THE INVENTION

The invention relates to the encapsulation of circuit boards. More particularly, the invention relates to the encapsulation of tandem stacked printed circuit boards.

SUMMARY OF THE INVENTION

An embodiment of the invention provides a method of making an encapsulated stack of circuit boards. The method includes assembling the stack of circuit boards from a plurality of circuit boards, the circuit boards being spaced apart from each other; inserting the stack into an internal volume of a shell, the shell having a first end and a second end opposite the first end, an input orifice adjacent the first end, and an output orifice adjacent the second end and on a side opposite the input orifice; positioning the shell such that the input orifice is at a lowest point of any part of the internal volume of the shell, and such that the output orifice is at a highest point of any part of the internal volume of the shell; angling the shell relative to horizontal; and injecting an encapsulating compound into the input orifice to fill the internal volume of the shell with the encapsulating compound.

Embodiments of the invention also provide a second method of making an encapsulated stack of circuit boards. The method including assembling the stack of circuit boards from a plurality of circuit boards, the circuit boards being spaced apart from each other, and a plurality of electronic components being mounted on at least one of the circuit boards; inserting the stack into an internal volume of a shell, the shell having a first end and a second end opposite the first end, an input orifice adjacent the first end, and an output orifice adjacent the second end and on a side opposite the input orifice; positioning the shell such that the input orifice is at a lowest point of any part of the internal volume of the shell, and such that the output orifice is at a highest point of any part of the internal volume of the shell; angling the shell relative to horizontal; heating and degassing an encapsulating compound; and injecting the encapsulating compound into the input orifice to fill the internal volume of the shell with the encapsulating compound.

Embodiments of the invention also provide a third method of making an encapsulated stack of circuit boards. The method includes assembling the stack of circuit boards from a plurality of circuit boards, the circuit boards being spaced apart from each other; inserting the stack into an internal volume of a shell, the shell having a first end and a second end opposite the first end, and an input orifice adjacent the first end; positioning the shell such that the input orifice is at a highest point of any part of the internal volume of the shell; angling the shell relative to horizontal; and injecting a dry encapsulating compound into the input orifice to fill the internal volume of the shell with the encapsulating compound

BRIEF DESCRIPTION OF THE DRAWINGS

Further advantages and details of the invention follow from the exemplary embodiments and are explained in the following with the aid of the Figures, in which.

DETAILED DESCRIPTION OF THE INVENTION

The invention will be described using the example of an encapsulated unit in which a stack of circuit boards are encapsulated in a shell. Although the invention will be described using this example, it is noted that the invention can be used to encapsulate other devices including, for example, circuit boards of other configurations.

Examples of this invention provide a simplified and efficient method for encapsulating a stacked group of boards, for example printed circuit boards, to protect the physical components soldered or bonded to the boards from high G-load and/or a high compression physical environment. Examples of the invention use a thin-walled canister or shell to house the stacked (or tandem) board assembly. The shell contains a potting medium, or encapsulating compound, that surrounds the boards and the components bonded thereto. As described below, by tilting the shell at a particular angle while the encapsulating compound is introduced, entrapment of air within the canister can be minimized. The reduction or elimination of entrapped air within the finished unit greatly improves the ability of the unit to withstand high G-loads and high compression without the boards or the components bonded to the boards suffering damage.

Figure 1:
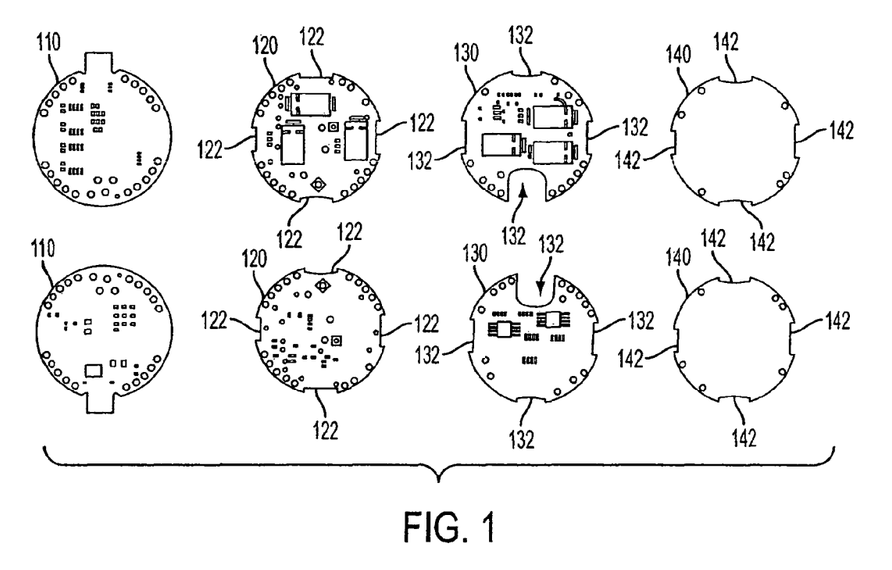
FIG. 1 is a plan view of examples of circuit boards in accordance with the invention.

FIG. 1 shows an example of four circuit boards, 110, 120, 130, 140 in accordance with the invention. Both sides of each board are shown in FIG. 1.

Figure 2:
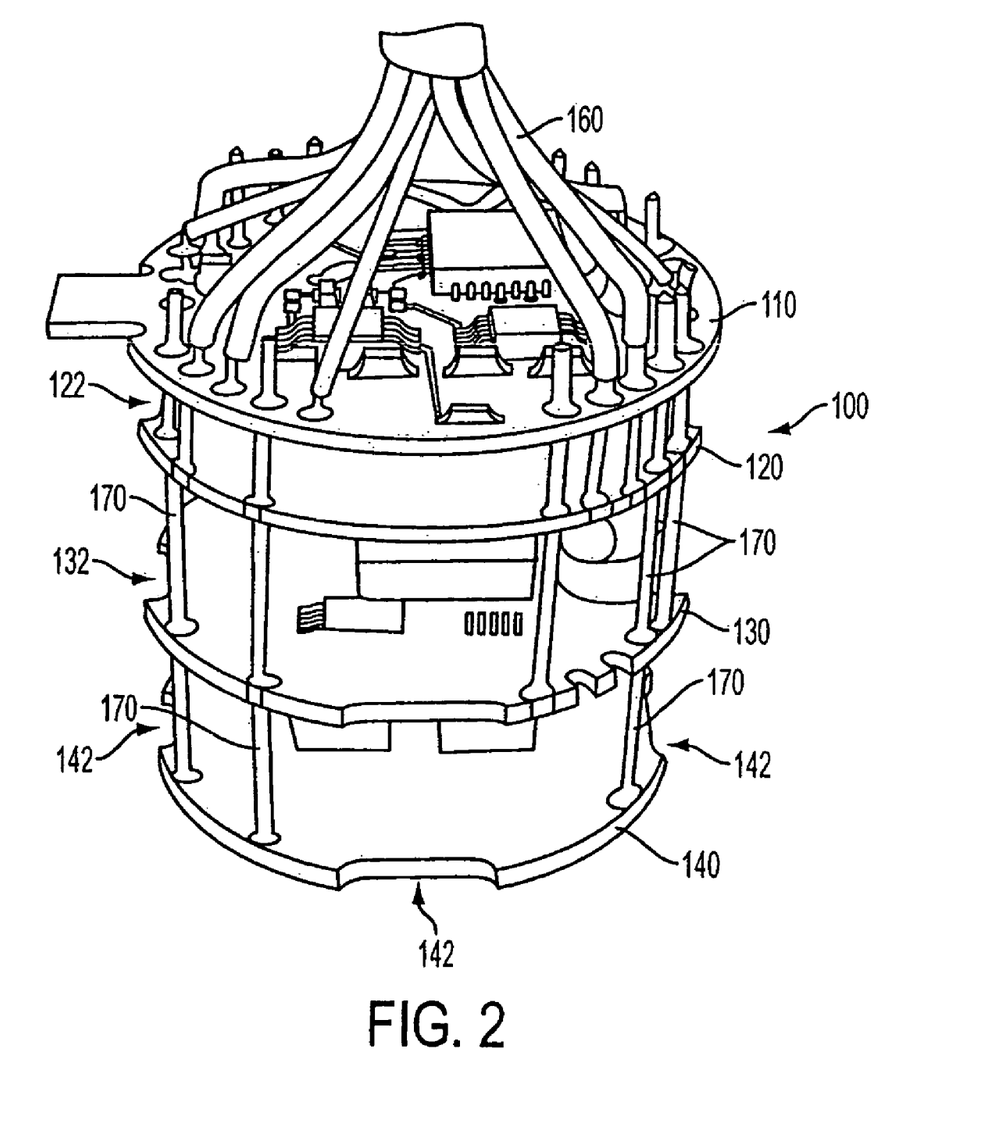
FIG. 2 is a perspective view of an assembled stack of circuit boards in accordance with the invention.

FIG. 2 shows an assembled stack of boards 100. The boards in this example are spaced apart from each other and held together by interconnecting wires 170. The rigidity of the assembled stack 100 can be improved by, for example, tinning interconnecting wires 170 or by using solid bus wire. At least a minimum level of rigidity of stack 100 is desirable in order to prevent damage to stack 100 prior to and during encapsulation. In this example, all interconnecting wires 170 are positioned around the periphery of the stacked printed circuit boards to simplify assembly and soldering. However, some or all of interconnecting wires 170 can be placed away from the periphery of the boards.

Figure 3:
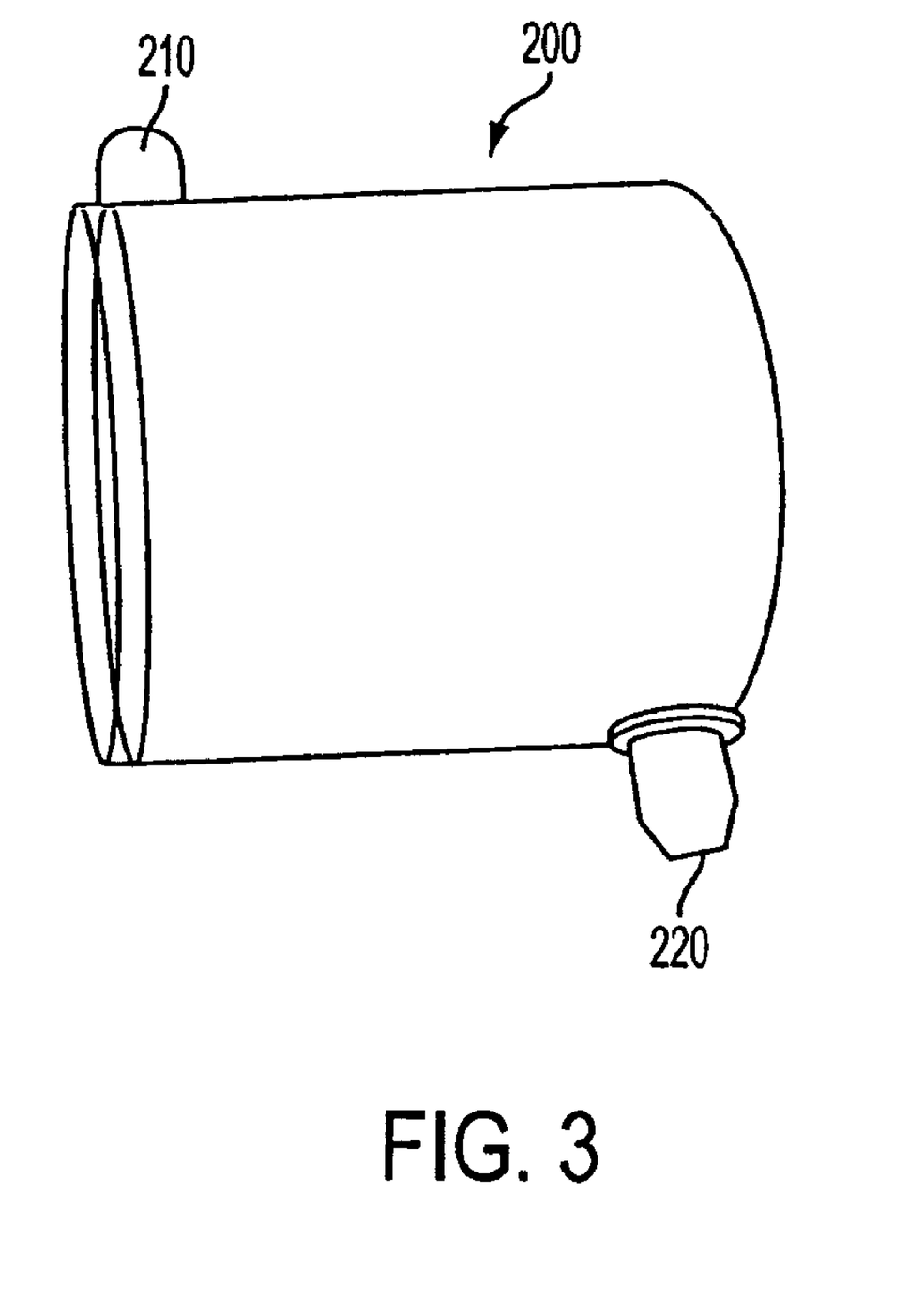
FIG. 3 is a perspective view of a shell in accordance with an example of the invention.

FIG. 3 shows a shell 200 into which stack 100 is inserted prior to encapsulation. In this example, shell 200 has an input orifice 210 and an output orifice 220. Input orifice 210 and output orifice 220 are used during the encapsulation process (described further below).

Figure 4:
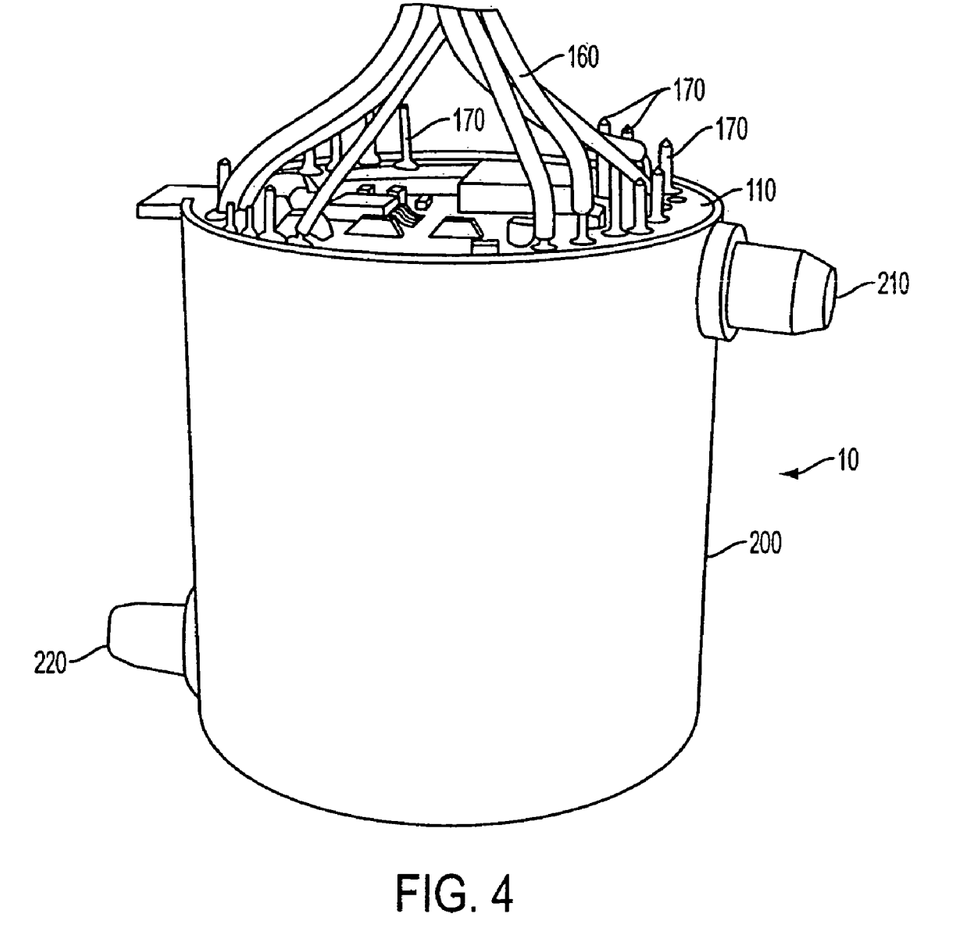
FIG. 4 is a perspective view of the stack shown in FIG. 2 inserted into the shell shown in FIG. 3.

FIG. 4 shows stack 100 positioned in shell 200 prior to encapsulation. In this example, circuit board 110 acts as a cap that seals off shell 200 and defines, along with the sides and bottom of shell 200, an interior volume for encapsulation. As can be seen in FIGS. 2 and 4, leads 160 can be attached to circuit board 110 for communication between the finished encapsulated unit and outside devices. Other examples can use a separate cap instead of circuit board 110 to seal off the encapsulated interior volume.

As shown in FIGS. 1 and 2, circuit board 120 is provided with relief paths 122, circuit board 130 is provided with relief paths 132, and circuit board 140 is provided with relief paths 142. The relief paths facilitate the flow of the encapsulating compound during the encapsulation process. Other or additional relief paths, including paths located away from the periphery of the boards, can be used.

The encapsulation process will now be described with reference to FIGS. 5 and 6. Although drawing a vacuum on the output orifice 220 can provide an advantage when evacuating air during the encapsulation process, successful encapsulation can usually be achieved by first degassing the encapsulating compound and then pumping the pre-warmed compound directly into the input orifice.

Figure 6:
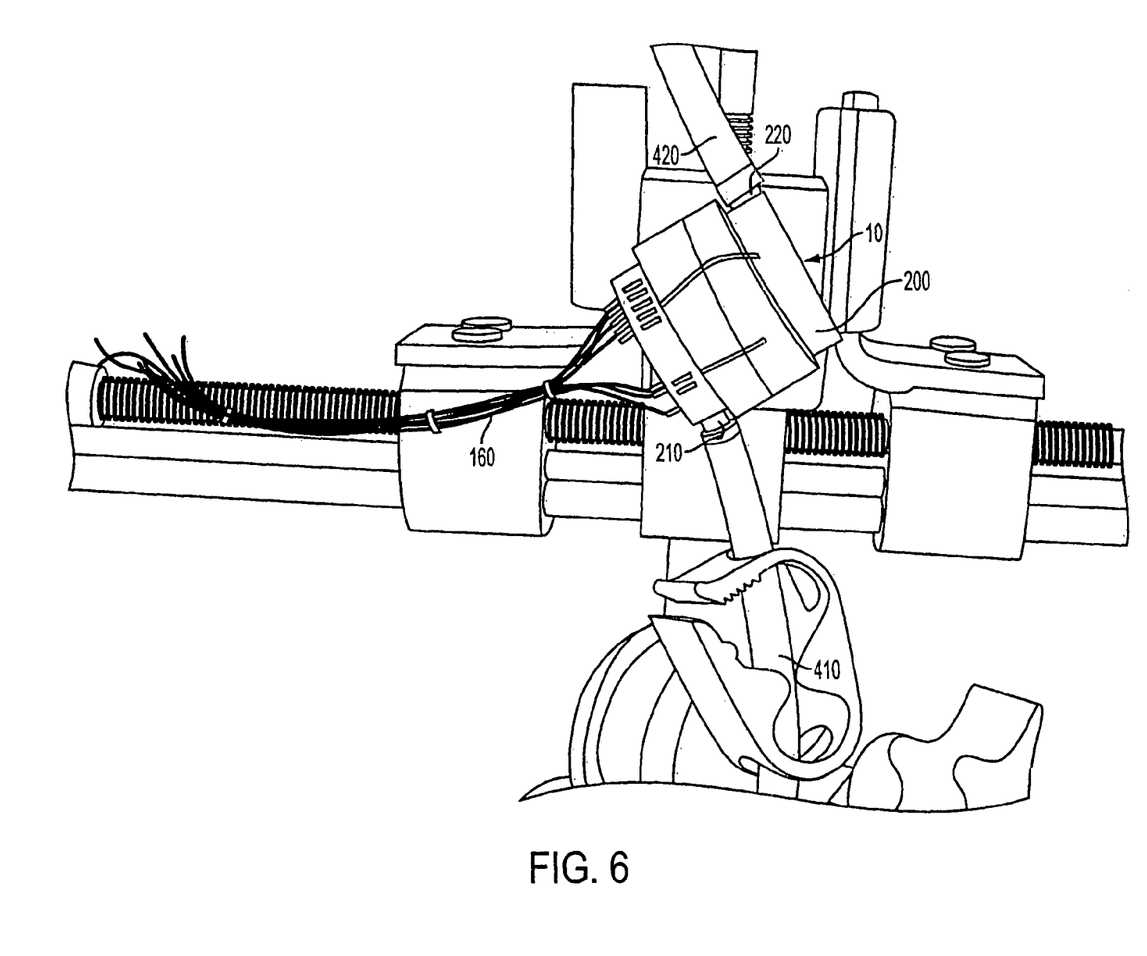
FIG. 6 is a side view of an encapsulating unit in accordance with an example of the invention ready to be filled with encapsulating compound.

FIG. 6 shows a unit 10 ready for the encapsulation process. In this example, shell 200 is tilted at an angle so that input orifice 210 is the lowest point of any part of the internal volume of shell 200 and such that output orifice 220 is the highest point of any part of the internal volume of shell 200. The tilt angle can be determined based on the shape of the boards, wires and components in shell 200 and the viscosity of the encapsulating compound used. The tilt angle can be, for example, between 40° and 50° from horizontal. A specific embodiment of the invention used a tile angle of approximately 45° from horizontal. This angular placement of the shell promotes flow of a liquid encapsulating compound from the lowest point to the highest point of the interior volume of the shell while minimizing the entrapment of air within the shell. This flow is facilitated by the relief paths discussed earlier that are provided in boards 120, 130, 140. In the example shown in FIG. 6, encapsulating compound is introduced through an inlet tube 410 that is attached to input orifice 210. An outlet tube 420 is attached to output orifice 220 to contain excess encapsulating compound that exits output orifice 220 during the encapsulation process. Outlet tube 420 can also be used to draw a vacuum on shell 200 through output orifice 220.

Figure 5:
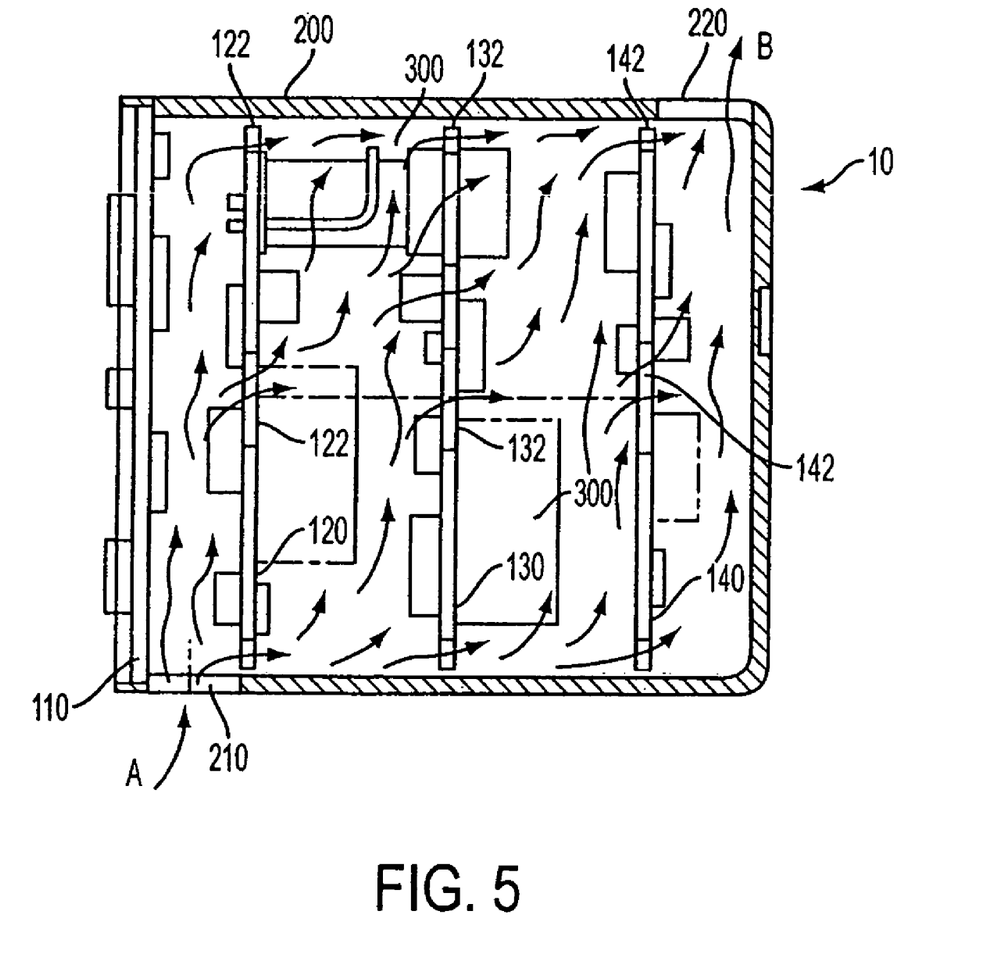
FIG. 5 is a side view of an example of the invention being filled with encapsulating compound.

FIG. 5 shows an example of the flow of encapsulating compound 300 through shell 200, around boards 110, 120, 130, 140 and out output orifice 220. Arrow A represents the inward flow of the encapsulating compound 300 into input orifice 210 and arrow B represents the outward flow of encapsulating compound out of output orifice 220.

After the encapsulating compound has hardened, input orifice 210 and out put orifice 220 can be ground or machined to be flush with the outside surface of shell 200.

The above example was described using a wet encapsulating compound. An angular encapsulation process in accordance with the invention can also be used with a dry encapsulating media such as glass beads or hollow glass spheres in lieu of a wet compound (such as, for example, an epoxy resin or a resin system containing fillers). In the entirely dry encapsulation process, the dry particles are channeled in a similar fashion as with a wet resin system. The angular positioning of the stacked boards, together with the use of relief paths on the boards, promotes flow of the dry media to fully surround and encapsulate the various components on the boards. In order to promote better flow of the dry media, shell 200 can be vibrated during the encapsulation process. The dry encapsulation process is preferably performed using a flow path that is the reverse of the wet encapsulation process. For example, hollow glass microspheres can be introduced at the highest most point of the shell and then vibrated progressively toward the lowest most point of the shell. In particular embodiments designed for dry encapsulation, an exit orifice is not included. In addition, the dry encapsulation process requires the sealing of the input orifice after encapsulation is completed.

The invention is not limited to the above-described exemplary embodiments. It will be apparent, based on this disclosure, to one of ordinary skill in the art that many changes and modifications can be made to the invention without departing from the spirit and scope thereof.

What is claimed is:

1. A method of making a finished encapsulated unit, comprising:
   constructing a circuit board assembly from a plurality of circuit boards, the circuit boards being spaced apart from each other and interconnected via at least one wire or electrical contact;
   inserting the circuit board assembly into an internal volume of a shell such that an end of the at least one wire or electrical contact extends outside the internal volume of the shell, the shell having
      a first end and a second end opposite the first end,
      an input orifice adjacent the first end, and
      an output orifice adjacent to the second end and on a side opposite the input orifice;
   angling the shell relative to horizontal to position the shell such that the input orifice is at a first point lower than any other part of the internal volume of the shell, and such that the output orifice is at a second point higher than any other part of the internal volume of the shell; and
   injecting an encapsulating compound into the input orifice to fill the remaining internal volume of the shell with the encapsulating compound, wherein the finished encapsulated unit comprises the circuit board assembly, the shell, and the encapsulating compound, wherein the finished encapsulated unit is adapted to be coupled to at least one outside device and communicate with the at least one outside device via the at least one wire or electrical contact.

2. The method of claim 1, wherein a plurality of electronic components are mounted on at least one of the circuit boards.

3. The method of claim 1, wherein the circuit board assembly comprises at least three circuit boards arranged in a stack.

4. The method of claim 1, wherein the encapsulating compound is degassed prior to it being injected into the input orifice.

5. The method of claim 4, wherein the encapsulating compound is heated prior to it being injected into the input orifice.

6. The method of claim 1, wherein the injection of encapsulating compound into the input orifice is pulsed to allow the encapsulating compound to flow over and around components mounted on the circuit boards.

7. The method of claim 1, further comprising attaching a tube so the output orifice and allowing the encapsulating compound to continue out of the exit orifice and into the tube.

8. The method of claim 1, wherein the shell is angled between 40 degrees and 50 degrees relative to horizontal prior to injecting the encapsulating compound.

9. The method of claim 8, wherein the shell is angled at substantially 45 degrees relative to horizontal prior to injecting the encapsulating compound.

10. The method of claim 1, wherein a circuit boards acts as a lid to the shell.

11. The method of claim 1, wherein a separate cap acts as a lid to the shell.

12. The method of claim 1, wherein a space exists between an outer periphery of at least one of the plurality of circuit boards and the inside of the shell, the space being sufficiently large for the encapsulating compound to flow between the at least one circuit board and the shell.

13. The method of claim 1, wherein the circuit boards are assembled into the stack by interconnecting the circuit boards to each other with a plurality of wires.

14. The method of claim 13, wherein the at least one wire or electrical contact are connected to the circuit boards at peripheral edges of the circuit boards.

15. The method of claim 14, wherein the at least one wire or electrical contact are attached to the circuit boards before the stack is inserted into the shell.

16. The method of claim 1, wherein the encapsulating compound is a wet resin.

17. An encapsulated stack of circuit boards made by the method of claim 1.

18. A method of making a finished encapsulated unit, comprising:

constructing a circuit board assembly from a plurality of circuit boards, the circuit boards being spaced apart from each other and interconnected via at least one wire or electrical contact;

inserting the circuit board assembly into an internal volume of a shell such that an end of the at least one wire or electrical contact extends outside the internal volume of the shell, the shell having
 a first end and a second end opposite the first end, and
 an input orifice adjacent to the first end;

positioning the shell such that the input orifice is at a point higher than any other part of the internal volume of the shell;

angling the shell relative to horizontal; and injecting a dry encapsulating compound into the input orifice to fill the remaining internal volume of the shell with the encapsulating compound, wherein the finished encapsulated unit comprises the circuit board assembly, the shell, and the dry encapsulating compound, wherein the finished encapsulated unit is adapted to be coupled to at least one outside device and communicate with the at least one outside device via the at least one wire or electrical contact.

19. The method of claim 18, further comprising vibrating the shell during the injection of the encapsulating compound.

20. An encapsulated stack of circuit boards made by the method of claim 18.

21. The method of claim 18, wherein each circuit board contains a relief path to facilitate the flow of the dry encapsulating compound through the shell and around the plurality of circuit boards.

22. A method of making a finished encapsulated unit, comprising:

constructing a rigid circuit board assembly from a plurality of circuit boards, the circuit boards being spaced apart from each other and interconnected via at least one wire or electrical contact;

inserting the rigid circuit board assembly into an internal volume of a shell such that an end of the at least one wire or electrical contact extends outside the internal volume of the shell; and injecting an encapsulating compound into the input orifice to fill the remaining internal volume of the shell with the encapsulating compound, wherein the finished encapsulated unit comprises the rigid circuit board assembly, the shell, and the encapsulating compound, wherein the finished encapsulated unit is adapted to be coupled to at least one outside device and communicate with the at least one outside device via the at least one wire or electrical contact.

23. The method of claim 22, wherein the circuit boards are interconnected and spaced apart from each other via tinned wires to form the rigid circuit board assembly.

24. The method of claim 22, wherein the circuit boards are interconnected and spaced apart from each other via solid bus wires to form the rigid circuit board assembly.

25. The method of claim 22, wherein a space exists between an outer periphery of at least one of the plurality of circuit boards and the inside of the shell, the space being sufficiently large for the encapsulating compound to flow between the at least one circuit board and the shell.

26. The method of claim 1, wherein the encapsulating compound is a wet resin.

* * * * *